United States Patent [19]

Kosonocky et al.

[11] 4,134,028
[45] Jan. 9, 1979

[54] CHARGE TRANSFER CIRCUITS WITH COMPENSATION FOR TRANSFER LOSSES

[75] Inventors: Walter F. Kosonocky, Skillman; Donald J. Sauer, Plainsboro, both of N.J.

[73] Assignee: RCA Corporation, New York, N.Y.

[21] Appl. No.: 775,408

[22] Filed: Mar. 7, 1977

[51] Int. Cl.² .................... G11C 19/28; H01L 29/78
[52] U.S. Cl. .................... 307/221 D; 357/24
[58] Field of Search ............... 357/24; 307/221 D

[56] References Cited

U.S. PATENT DOCUMENTS

| 3,914,748 | 10/1975 | Barton et al. | 357/24 |
| 3,947,698 | 3/1976 | Cheek et al. | 357/24 |
| 3,961,352 | 6/1976 | Colton et al. | 357/24 |
| 3,967,254 | 6/1976 | Kosnocky et al. | 357/24 |
| 4,007,446 | 2/1977 | Elmer et al. | 357/24 |
| 4,013,897 | 3/1977 | Kamigaki et al. | 357/24 |

OTHER PUBLICATIONS

Vanstone et al. "The Measurement of the Charge Residual for CCD Transfer...", Solid-State Electronics, vol. 17 (9/74) pp. 889–895.

Sequin et al., Charge Transfer Devices, Academic Press, N.Y. (7/75) pp. 70–76, 247–249.

Primary Examiner—William D. Larkins
Assistant Examiner—Gene M. Munson
Attorney, Agent, or Firm—H. Christoffersen; Samuel Cohen

[57] ABSTRACT

Each time a charge signal is shifted, it suffers a small transfer loss. In the charge transfer systems of interest here, that transfer loss charge combines with previous transfer loss charges to form a transfer loss sum charge packet which propagates behind the charge signal. In the present system each charge signal is restored to substantially its initial level, by combining the transfer loss sum charge packet for that charge signal with that charge signal once each n charge transfers, where n is a relatively large number such as 50 or more.

7 Claims, 19 Drawing Figures

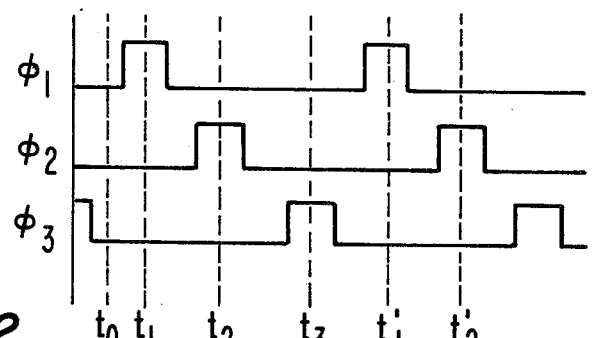
Fig. 2.
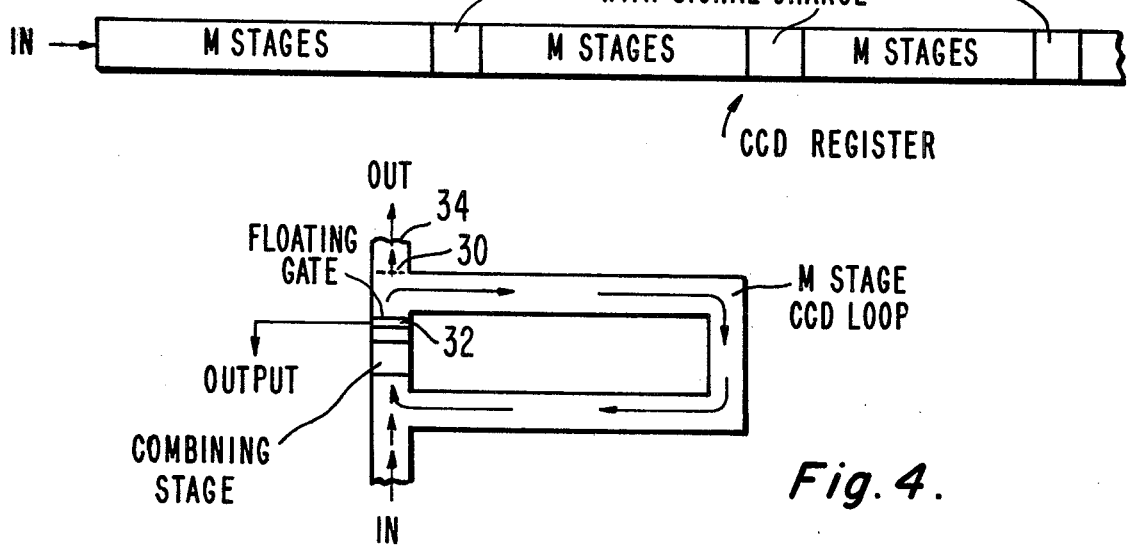
Fig. 3.
Fig. 4.
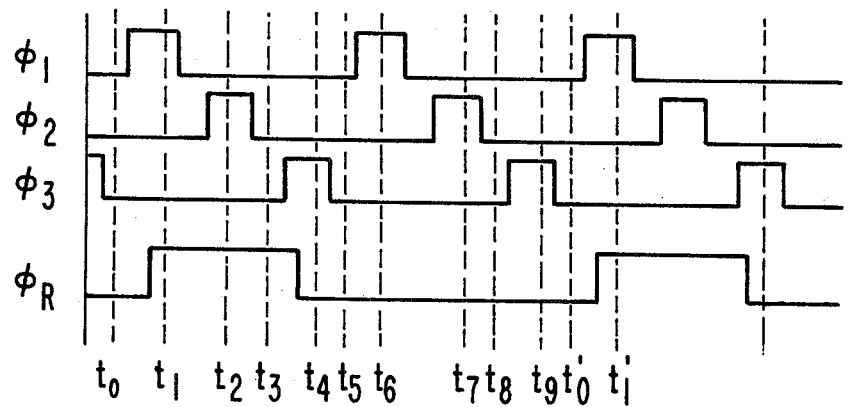
Fig. 6.

CHARGE TRANSFER CIRCUITS WITH COMPENSATION FOR TRANSFER LOSSES

The present invention relates to charge transfer devices and particularly to methods and apparatus for compensating for transfer losses in such devices.

In a charge transfer device such as one of the charge coupled device (CCD) type, each time a charge signal is shifted from the substrate region beneath one electrode to the substrate region beneath the following electrode, it suffers a small transfer loss which may be of the order of say a $10^{-4}$ to $10^{-5}$ part of the signal. If the charge signal is a digital signal, it can be "refreshed" after every n shifts (n being some large number such as 50 to several hundred or more) by returning the signal to one of two reference levels representing binary one and binary zero, respectively, depending upon the amplitude of the signal. However, analog signals such as video signals cannot be processed in this way. There are an infinite number of analog signal levels which are possible and one cannot determine simply by observing the amplitude of an analog signal which has suffered some deterioration due to transfer loss, what level the deteriorated analog signal should be returned to.

In systems embodying the present invention, a charge signal which has suffered transfer loss is returned to its original level or close to its original level by combining with this charge signal at least one sum charge packet constituting substantially the sum of the transfer losses it has suffered. In the present systems this sum charge packet travels behind (upstream of) the charge signal from which it is derived and after each n transfers either this charge packet is advanced and combined with the charge signal or the charge signal is delayed until the sum charge packet catches up and combines with the charge signal.

In the drawing:

FIG. 2 is a drawing of waveforms employed for operating the CCD of FIG. 1;

FIG. 3 is a schematic showing of a CCD system embodying the invention;

FIG. 4 is a schematic showing of another form of CCD embodying the invention;

FIG. 6 is a drawing of waveforms employed to operate the circuit of FIG. 5;

Figure 1:
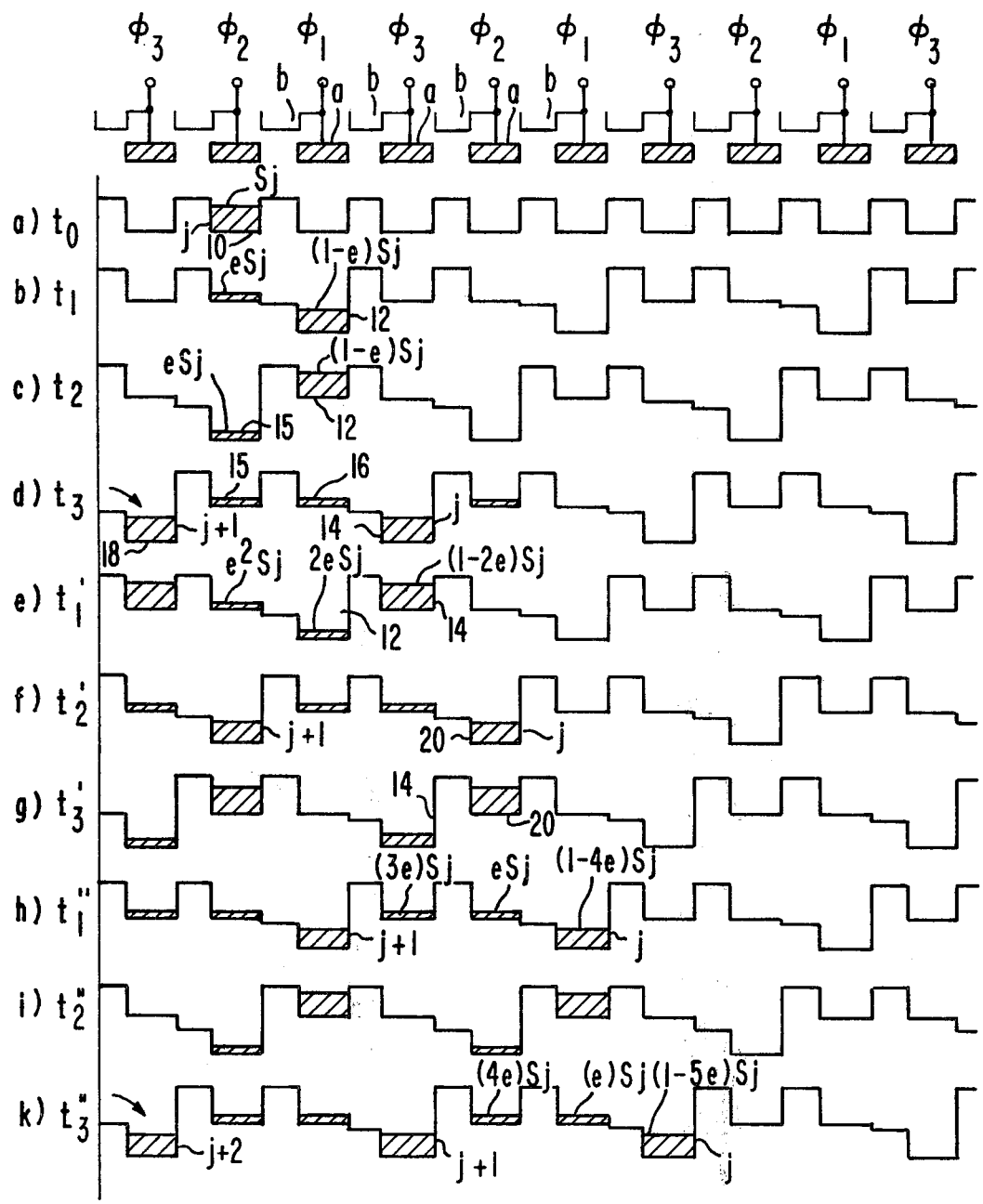
FIG. 1 is a schematic showing of a charge coupled device (CCD) and also shows surface potential profiles obtained during its operation.

FIG. 1 and many of the other figures illustrated, show at the top, the electrodes of a CCD. These electrodes all may be formed of polysilicon or alternate electrodes may be formed of polysilicon and they may be overlapped by metal (such as aluminum) electrodes. The electrodes are insulated from the substrate (not shown in FIG. 1) by an insulating layer such as one formed of silicon dioxide. Of each electrode pair receiving a common drive voltage, the one represented by a cross-hatched rectangle is closer to the substrate than the overlapping electrode, the latter being represented by a curved line. A more realistic showing of such electrodes appears in FIG. 17. In response to a clock voltage ($\phi$) a storage well forms under a cross-hatched electrode and a transfer barrier forms beneath the curved electrode connected thereto, as is understood in the art. Other alternative electrode structures for forming asymmetrical surface potential profiles such as those with ion implanted barriers or which employ voltage offsets are possible and within the scope of the present invention.

Figure 17:
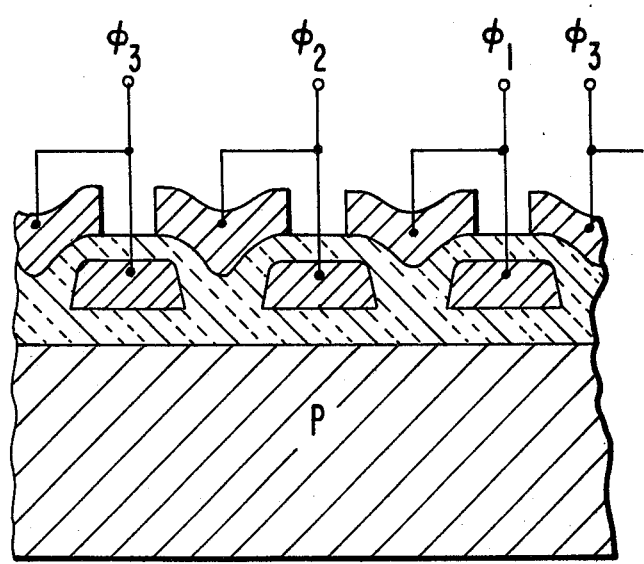
FIG. 17 is a section through a CCD showing certain structural details.

For purposes of illustration, a P type silicon substrate "surface channel" CCD is assumed for all embodiments of the invention illustrated, as is shown in FIG. 17. As the charge signals are electrons, this form of device is normally termed an "N channel" CCD. The teachings of the present application are equally applicable to P channel CCD's and to buried channel CCD's.

There are a number of different types of clocking which may be employed in the present invention. Before discussing these specifically, a general discussion is in order.

In a conventional N phase CCD (where N is an integer equal to three or more) there are N electrodes, sometimes known as "transfer gates", and N clock voltages needed for each signal charge packet. In conventional two phase CCD's, two clock phase voltages are used to store and transfer each signal charge packet. When both clock voltages are either "on" or "off", assuming the substrate is appropriately biased, there are two storage wells per stage, one storage well for each pair of gates. At any one time, only one storage well of the stage will store a charge signal and the other well will be empty. In two-phase operation, the function of each empty well is to receive the charge transferred thereto from the previous well.

In so-called "electrode-per-bit" clocking, sometimes known as "ripple-clock" operation, more compact storage of charge is possible. Here, for a N phase clock, there can be stored and transferred N-1 charge signal packets. In other words, there is one empty potential well for transferring charge for each N-1 wells which store signal charge. The price paid for this higher packing density is that at any time, only one of N-1 charge packets can be transferred into the available empty well. Such transfer can be accomplished either by "drop clock" or "push clock" operation (these terms will be defined later). The drop-clock, ripple-clock form of operation is used to illustrate FIGS. 1, 2 and 5–10. However, push-clock, ripple-clock operation could be used instead.

The waveforms for operating the CCD of FIG. 1 are shown in FIG. 2 and the surface potential profiles at different times are illustrated in FIG. 1. It may be assumed that the substrate is biased in a sense so that when the drive voltage is low (say at ground level) there is a potential well beneath each a electrode of a pair (a, b) and a potential barrier beneath each b electrode of a pair. The multiple phase voltages are of the non-overlapping type and the operation obtained is the "drop clock", operation mentioned above. This expression is used as the charge signal propagation occurs when a multiple phase or "clock" voltage causes a potential well to become deeper so that the charge carriers in the preceding well (whose level is not decreased but rather remains unchanged) "drop" into the succeeding deeper well. This contrasts with so-called "push clock" operation where the well containing carriers is decreased in depth to "push" the carriers into the succeeding well.

At time $t_0$, as $\phi_2$ is high, there is a potential well present beneath the $\phi_2$ electrodes. It may be assumed that the j'th charge is in the potential well 10 beneath the first $\phi_2$ electrode, j being an arbitrarily chosen ordinal number. It also may be assumed, for purposes of this discussion, that this charge is at a reference level identified as $S_j$.

At time $t_1$, $\phi_1$ is high and $\phi_2$ is low so the charge signal has shifted from well 10 to well 12 beneath the following $\phi_1$ electrode. In the transfer process, a small amount, the e'th part, of the charge signal $S_j$ has been left behind so that the charge in well 12 is $(1-e)S_j$. The transfer loss charge $eS_j$ normally is a very small fraction such as $10^{-4}$ to $10^{-5}$ or so of the charge signal.

At time $t_2$, $\phi_1$ is low, $\phi_2$ is high and $\phi_3$ is low. The j'th charge signal of amplitude $(1-e)S_j$ remains in potential well 12.

At time $t_3$, $\phi_3$ is high and $\phi_1$ and $\phi_2$ are both low. The charge packet formerly in well 12 has moved to well 14 beneath a $\phi_3$ electrode. Another transfer loss packet, 16, is left behind. Thus, the charge signal in well 14 is $(1-2e)S_j$. The following charge signal, identified as $j+1$, is present in potential well 18 beneath the first $\phi_3$ electrode shown.

At time $t_1''$, $\phi_1$ is high and $\phi_2$ and $\phi_3$ are low. The first transfer loss charges $eS_j$ from well 15 now combines with the charge packet 16 already present in potential well 12 to produce a sum charge packet $2eS_j$ in well 12. In the process of shifting, a small amount of transfer loss charge is left behind. Assuming the transfer loss to be $10^{-5}$, the amount of charge left behind would be $10^{-10}S_j$ or $e^2S_j$. For purposes of the present discussion, this very small second order signal loss is ignored. In the systems of some of the later figures, this square term is never recovered. In other of the systems to be discussed, means are provided for recovering even this small amount of charge.

At time $t_2'$, when $\phi_2$ is high and $\phi_1$ and $\phi_3$ are low, the charge signal from well 14 has transferred to well 20, again leaving a transfer loss charge $eS_j$ behind. Thus, the charge in well 20 is $(1-3e)S_j$. At time $t_3'$ the $eS_j$ transfer loss has combined with the $2eS_j$ transfer loss to produce a transfer loss sum charge packet $3eS_j$ in well 14, well 14 being behind well 20. The process above continues in the manner illustrated. It can be shown that after n shifts of the j'th charge signal, its level is $(1-ne)S_j$ and trailing this charge signal will be a transfer loss sum charge packet of amplitude approximately equal to $neS_j$.

FIG. 3 illustrates an embodiment of the invention. The system illustrated is a CCD register which has many stages. Most of the stages can be as illustrated in FIG. 1. In other words, each stage comprises three electrode means, each electrode means comprising one electrode such as a polysilicon electrode close to the substrate and a second electrode such as aluminum or polysilicon electrode further from the substrate and occupying the region between two electrodes (other alternatives are possible). After each M stages, however, there is a signal combining stage, where M may be some large number and will depend upon the transfer loss suffered per shift of a charge signal. With a charge transfer loss e of the order of $10^{-5}$, and with three sets of electrodes per stage, M may be as large as 500 or more (the larger the value of e, the smaller M should be). The combining stage sums the charge signal with the sum charge transfer loss packet trailing behind that charge signal, as will be shown in more detail shortly. Thus, after each M stages (after each 3M or more shifts in the case assumed), a deteriorated charge signal, which may be an analog signal such as a video signal, is restored or "refreshed", that is, it is returned to close to its original signal level.

FIG. 4 illustrates another form of the invention, this one comprising a CCD loop. If the loop has M stages, there need only be one combining stage for the entire loop; if the loop is larger, there may be additional combining stages. There may be a gating structure, illustrated by dashed lines 30, for causing the input signals to pass into the loop and to circulate there, or for causing the input signals to be supplied to the output port 34, as desired. Upon each pass through the loop, the combining stage refreshes the signal. A floating diffusion, or a floating gate such as illustrated schematically at 32, may be employed to obtain a nondestructive output from the system. The loop may be emptied by proper potentials applied to the gates illustrated at 30, which potentials cause the loop charge signals to be delivered to output port 34.

The present invention, as embodied, in FIGS. 3, 4 and the later figures, is of most use for CCD's operating in the clock frequency region where the transfer losses tend to be constant and independent of clock frequency. Typically, this corresponds to a very broad clock frequency range starting from a very low clock frequency to a certain cut-off clock frequency above which the losses tend to increase exponentially as the clock frequency is increased. In a CCD with n-type surface-channel and 10 $\mu$m gates this clock cut-off frequency is about 10 MHz. For a buried-channel CCD with 10 $\mu$m long gates it may be 20 MHz to more than 100 MHz depending on how deep the CCD channel is, which in turn, determines the amount of the drift-aiding fringing fields which are present.

Figure 5:
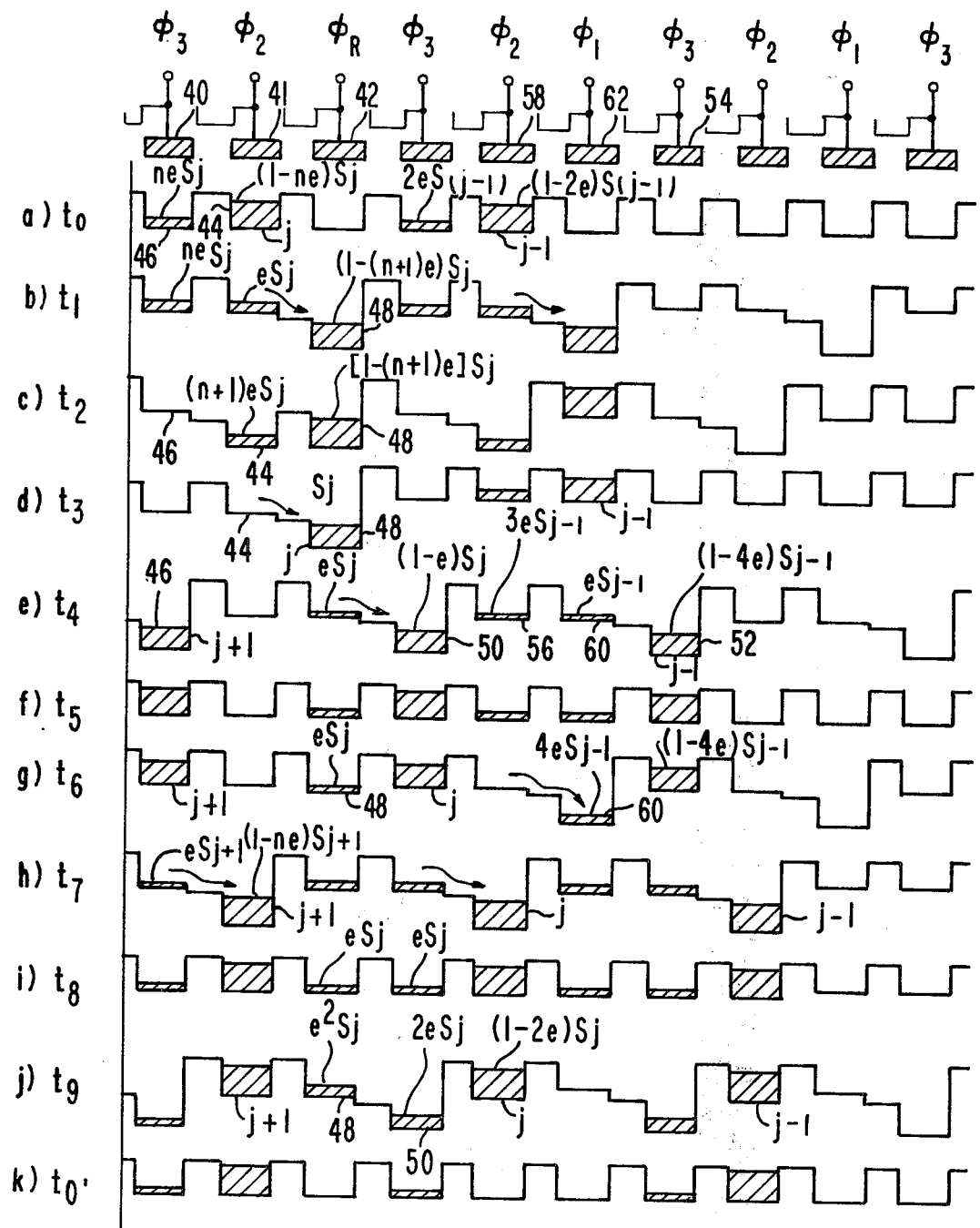
FIG. 5 is a schematic showing of a CCD combining stage and other stages which may be employed in the systems of FIGS. 3 and 4 and FIG. 5 shows also surface potential profiles obtained during the operation of the CCD.

FIG. 5 illustrates one form of combining stage which may be employed in the systems of FIGS. 3 and 4 and FIG. 6 illustrates the operating waveforms for FIG. 5. The electrode structure is the same as that illustrated in FIG. 1. However, each M stages, there is a combining stage illustrated at 40, 41 and 42, where the electrode 42, rather than receiving the multiple phase voltage $\phi_1$, receives instead the control waveform $\phi_R$. At time $t_0$, it is assumed that the j'th charge has arrived in the potential well 44 beneath electrode 41. It has suffered a transfer loss ne so that the amount of charge remaining is (1-ne)$S_j$. The sum loss charge packet derived from the signal charge in well 44 is in the potential well 46 following well 44. The well 46 therefore contains a sum loss packet substantially equal to ne$S_j$. It is not exactly equal to ne$S_j$ because the $e^2S_j$ losses mentioned briefly above do not accumulate in the well 46 but rather are delayed in the transfer process and combined with the following signal packet. The sum of the $e^2S_j$ losses generally is relatively small.

At time $t_1$, $\phi_1$ is high, $\phi_2$ and $\phi_3$ are low, and $\phi_R$ is high. The j'th charge has transferred from well 44 beneath electrode 41 to well 48 beneath electrode 42. The charge in well 48 is [1-(n+1)e]$S_j$, the loss e$S_j$ remaining in well 44.

At time $t_2$, $\phi_1$ and $\phi_3$ are low and $\phi_2$ and $\phi_R$ are high. Note that unlike $\phi_1$, $\phi_2$ or $\phi_3$, $\phi_R$ remains high for a period such that $\phi_1$, $\phi_2$ and $\phi_3$ all are high at some point during $\phi_R$. The sum charge packet ne$S_j$ in well 46 has combined with the charge packet e$S_j$ in well 44 by time $t_2$ to produce a sum charge packet (n+1)e$S_j$ in well 44. The charge signal [1-(n+1)e]$S_j$ remains in well 48.

At time $t_3$, $\phi_1$, $\phi_2$ and $\phi_3$ are all low and $\phi_R$ is high. The sum loss charge packet formerly in well 44 is now shifted to well 48 where it combines with the j'th charge signal (from which the sum loss charge packet was lost). Thus, at time $t_3$, the j'th charge signal is restored to substantially its original value $S_j$.

At time $t_4$, $\phi_3$ is high and the remaining driving voltages are low. The j'th charge formerly in well 48 has shifted to well 50 leaving a transfer loss e$S_j$ behind. A similar action occurs at each signal restoring stage. The (j+1)'th charge has arrived in well 46 beneath electrode 40. The (j-1)'th charge packet is in well 52 beneath $\phi_3$ electrode 54. The latter is the fourth electrode from the $\phi_R$ electrode 42 and the (j-1)'th charge packet has suffered four transfer losses, that is, its amplitude is (1-4e)$S_{j-1}$. Three parts of this loss are in well 56 beneath $\phi_2$ electrode 58 and one part of this loss is at 60 beneath electrode 62.

Skipping to time $t_6$, when $\phi_1$ is high and the remaining driving voltages are low, the situation is as shown at g in FIG. 5. The loss charge packet formerly in well 56 has combined with the loss charge packet in well 60 to form a loss charge of amplitude 4e$S_{j-1}$.

Note, the part of the loss from the j'th signal $S_j$ is still stored in well 48. This loss signal e$S_j$, however, catches up with the other losses of the j'th signal packet at time $t_9$ when it combines at the well 50 with another loss term e$S_j$ to form a loss charge 2e$S_j$. The effective charge loss from the j'th charge packet to the (j+1)'th charge packet at this transfer is a second order loss $e^2S_j$ (shown at 48, time $t_9$) which should be much smaller than the total second order loss term $$\frac{(ne)^2}{2} S_j$$

for the n transfers between signal restoration stages. This total loss term is obtained by adding the successive $e^2$ terms as follows.

$$e^2 + 2e^2 + 3e^2 \cdots (n+1)e^2 = \frac{(n+1)(n+2)e^2}{2}$$

or for $n >> 1$ or $e << 1$ the total fractional transfer loss per n transfers of say the j'th signal of amplitude $S_j$ is $$\left[\frac{(ne)^2}{2}\right]S_j$$

and for Mn transfers of such a signal (assuming a system with M signal restoring stages) the unrecovered signal loss will be $$\frac{n^2e^2M}{2}S_j.$$

This, of course, is much smaller than the net loss Mne$S_j$ which occurs in the Mn transfers of a signal in a conventional CCD. Such a conventional CCD, however, will store twice as many such signals or for the same storage capacity will require only Mn/2 transfers.

The remainder of the operation of the system of FIG. 5 is believed to be straightforward from the waveforms illustrated. In summary, what occurs in the circuit of FIG. 5 is that after n shifts of a charge signal, the trailing sum loss charge packet is advanced until it reaches the position of the charge signal from which it was derived. At this position (well 48 in FIG. 5) it combines with the charge signal and in this way restores the charge signal to close to its original value. After the combining process, the charge signal again may be shifted n times and thereafter the deteriorated charge signal again restored to close to its original level. The second order charge loss (the $e^2$ term) is not recovered but the total of the $e^2$ terms $$\left(\frac{(ne)^2}{2} S_j\right)$$

is relatively small.

Note that in the system illustrated, a charge signal in one stage is followed by two potential wells. During one time interval of each period, one of these wells is essentially empty and is used to receive the succeeding signal packet and another of the wells contains a sum charge loss packet. See, for example, a and k of FIG. 5.

As is well understood in the art, it is often desirable in the operation of a CCD to employ "fat zeros". A fat zero is a charge of substantial amplitude and its function is to fill the "fast trapping states" at the interface of the substrate surface and the insulator overlying this surface in a surface channel CCD (or the bulk trapping states in a buried channel CCD). These trapping states otherwise remove charge from or supply charge to the signal charges as they are propagated along the length of the CCD and in this way introduce trapping losses in the operations of the CCD's.

In conventional CCD's the "fat zero" sometimes also known as a "bias charge" is introduced with the charge signal in the same well. Therefore, the magnitude of fat zero is always smaller than the magnitude of the signal plus the fat zero. In the approach illustrated in FIG. 7, the fat zero is placed in the well following the signal. Therefore, in this scheme the fat zero can be made large enough (essentially a full well) so that it is always larger than the signal charge packet preceeding it. The main advantage of a fat zero this large is that it keeps filled the trapping states which the signal "sees", to greatly reduce the trapping losses with long time constants. In other words, the circuit in FIG. 7 should be capable of removing the so-called "edge effect" losses which are believed to be associated with various types of charge trapping mechanisms.

Figure 7:
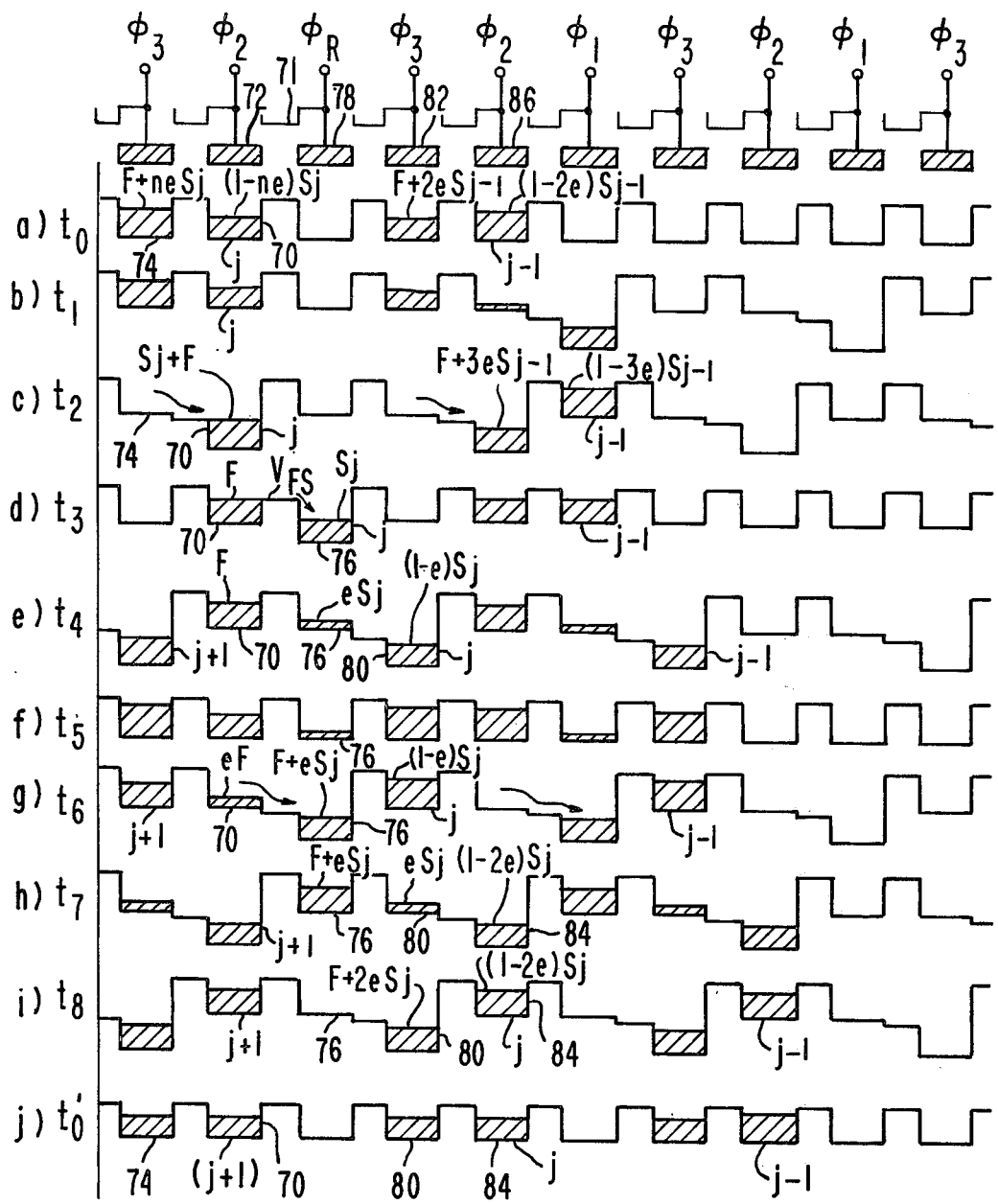
FIG. 7 is a schematic showing of another CCD combining stage and other stages embodying the invention and FIG. 7 shows also surface potential profiles obtained during the operation.
Figure 8:
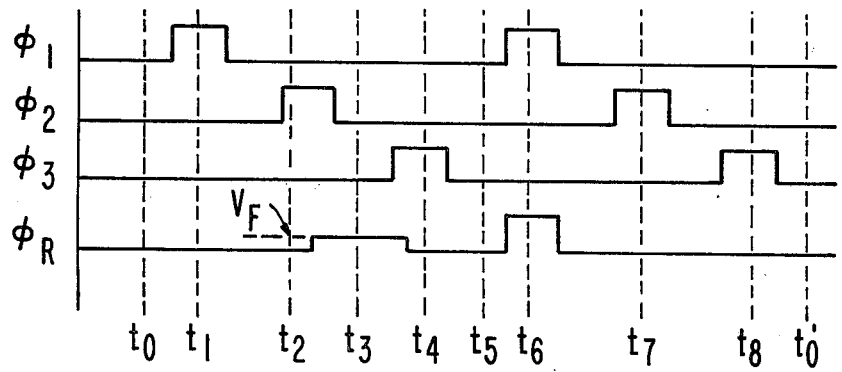
FIG. 8 is a drawing of waveforms for operating the CCD of FIG. 7.

FIG. 7 illustrates an embodiment of the invention employing fat zero charges which trail the signal charges, respectively. They may be introduced at the input end (not illustrated) of the CCD in conventional ways, well understood in the art, following each charge signal. Referring now both to FIGS. 7 and 8, at time $t_0$ the j'th charge has been shifted n times. It is in well 70 beneath electrode 72. The sum charge packet located in well 74 behind well 70, contains the fat zero charge F plus the sum loss charge packet $neS_j$.

At time $t_1$, $\phi_1$ is high and all other driving voltages are low. At time $t_2$, $\phi_2$ is high and all other driving voltages are low. At this time, the charge formerly in well 74 combines with the charge in well 70 to reconstitute the j'th charge to substantially its original level and to add thereto the fat zero level F. Thus, the charge presently in well 70 is at a level equal to substantially $S_j + F$, where $S_j$ is the initial charge signal level and F is the fat zero level.

At time $t_3$, $\phi_R$ is at the fat zero voltage level $V_F$. This produces a surface potential $V_{FS}$ at the semiconductor substrate beneath electrode 71. This surface potential acts as a relatively low potential barrier between well 70 beneath electrode 72 and well 76 beneath electrode 78. Some of the charge in well 70 flows over this barrier to well 76 leaving charge of amplitude F (the fat zero level) in well 70, and charge of amplitude $S_j$ in well 76. The j'th charge now has been restored to its original level and a fat zero at a standard level F trails the j'th charge.

At time $t_4$, $\phi_3$ is high and the remaining driving voltages are low and this set of voltages starts the restored charge travelling down the remainder of the CCD. As $\phi_3$ is high, the j'th charge propagates from well 76 to well 80 beneath electrode 82 leaving a transfer loss $eS_j$ behind at 76. The fat zero remains in well 70.

At time $t_6$, both $\phi_1$ and $\phi_R$ are high and $\phi_2$ and $\phi_3$ are low. The fat zero formerly at 70 propagates to well 76 where it combines with the first loss charge packet $eS_j$ in well 76.

At time $t_7$, $\phi_2$ is high and the remaining driving voltages are low. The j'th charge of level $(1-2e)S_j$ propagates to well 84 beneath electrode 86 leaving a loss charge $eS_j$ behind at 80. The j'th charge is now of amplitude $(1-2e)S_j$.

The losses suffered by the fat zero are the same at each stage, that is, eF as shown at 70, potential profile g of FIG. 7. This loss eF combines with the following charge packet j+1 by time $t_7$ as shown at h. In similar fashion, the eF loss suffered by the (j+1)'th charge packet combines with the (j+2)'th charge packet (not shown). As all F's are of essentially the same value, all eF's are also of essentially the same value. After several initial cycles of operation, because of the counter-acting effects of the eF additions and losses, they have no essential net effect on the signal amplitude.

At time $t_8$, $\phi_3$ is high and the remaining driving voltages are low. The charge formerly in well 76 now combines with the charge in well 80 to form a charge packet $F + 2eS_j$ in well 80. The j'th charge of amplitude $(1-2e)S_j$ is in well 84 immediately ahead of (downstream of) well 80.

Time $t'_0$ represents the start of the next period, assuming $t_0$ to be the start of the previous period. At time $t'_0$, the j'th charge is in well 84, its trailing charge packet is in well 80, the (j+1)'th charge is in well 70 and its trailing charge packet is in well 74, and so on. Note that there are three potential wells per stage and at this particular time, the signal charge is in the first well, the fat zero and loss charge are in the second well and the third well is empty. As in the case of the previous embodiment, the summation in the combining stage takes place by advancing the fat zero and loss charge packet until it reaches the charge signal from which the charge packet is derived.

In the embodiments discussed so far, the $e^2$ term is lost. In the embodiment illustrated in FIG. 9, each stage has four potential wells. In an arrangement of this kind, the second order loss term $e^2S$ can be retained and the successive $e^2S$ terms combined to form a second-order charge loss packet. This second-order charge loss packet propagates behind the sum loss charge packet and, as will be shown, at the summing stage these two charge packets are combined with the charge signal to restore the charge signal to close to its original value. The operation illustrated also includes fat zeros.

Figure 9:
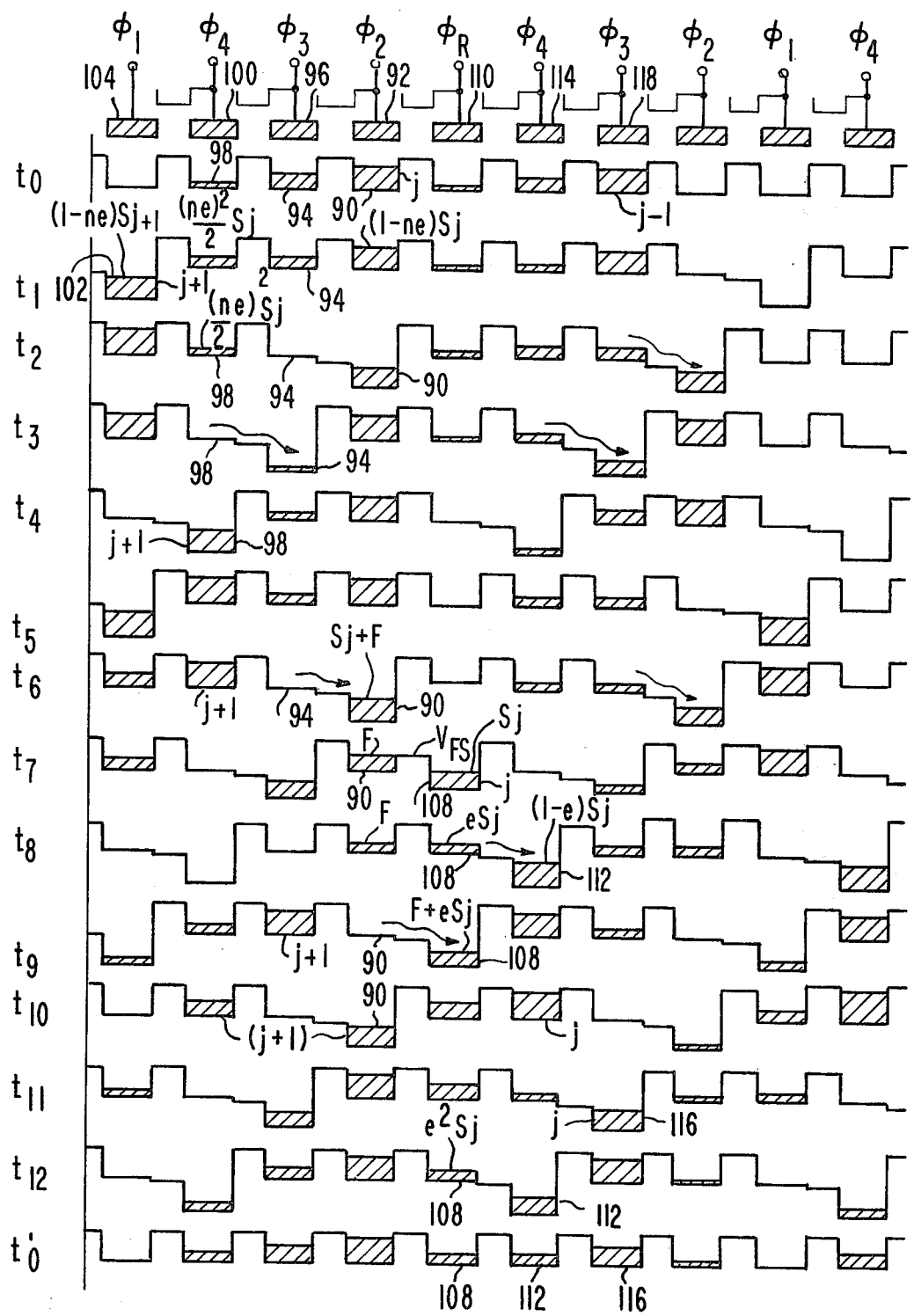
FIG. 9 is a schematic showing of another embodiment of the invention and shows also surface potential profiles.
Figure 10:
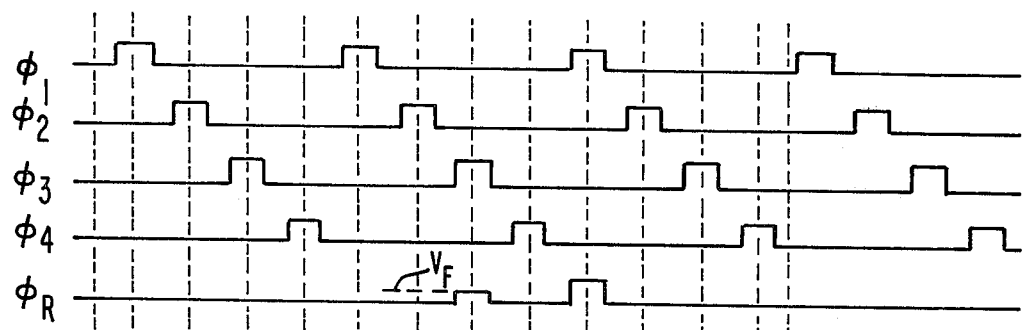
FIG. 10 is a drawing of waveforms employed for operating the circuit of FIG. 9.

FIGS. 9 and 10 should be referred to in the discussion which follows. It is assumed that at time $t_0$, the j'th charge (of level $(1-ne + (ne)^2/2)S_j$) is present in potential well 90 beneath $\phi_2$ electrode 92, its sum loss charge packet plus a fat zero charge $$F + [ne - (ne)^2] S_j$$

is present in potential well 94 beneath electrode 96 and the second order charge loss packet $$\frac{(ne)^2}{2} S_j$$

is present in well 98 beneath electrode 100. These trailing charge packets are produced naturally during the propagation of the j'th charge signal as will become clear from the discussion which follows.

At time $t_1$, $\phi_1$ is high and the remaining driving voltages are low. The next charge signal j+1 has propagated to well 102 beneath electrode 104. At time $t_2$, $\phi_2$ is high and the remaining driving voltages are low. The sum charge packet formerly in well 94 has propagated to well 90 where it combined with the charge signal. The total charge in well 90 is now $$F + \left[1 - \frac{(ne)^2}{2}\right] S_j.$$

At time $t_3$, $\phi_3$ is high and the remaining driving voltages are low. The second order charge loss packet has propagated from well 98 to well 94.

At time $t_4$, $\phi_4$ is high and the remaining driving voltages are low. The (j+1)'th charge has propagated to well 98 beneath electrode 100.

Skipping to time $t_6$, $\phi_2$ is high and the remaining driving voltages are low. The second order charge packet formerly in well 94 has propagated to well 90 where it combined with the $$F + \left[1 - \frac{(ne)^2}{2}\right]S_j$$

charge present in well 90. Accordingly, the charge present in well 90 is equal to $S_j + F$; that is, the charge signal has been restored to substantially its initial level $S_j$ and it is combined with a fat zero F.

At time $t_7$, $\phi_3$ is high, $\phi_R$ is high at the fat zero voltage level $V_F$ and the remaining driving voltages are low. The $\phi_R$ voltage creates a fat zero surface potential $V_{FS}$ beneath electrode 106. Some of the charge formerly present in well 90 has flowed over this barrier to well 108 beneath electrode 110, leaving behind the fat zero charge F at the reference fat zero level. The charge now in well 108 is at the restored level $S_j$ which is substantially equal to the initial value of the j'th charge.

At time $t_8$, when $\phi_4$ is high and the remaining driving voltages are low, the j'th charge shifts to well 112 beneath electrode 114 leaving a loss charge $eS_j$ behind at 108. At time $t_9$, $\phi_1$ and $\phi_R$ are high and the remaining driving voltages are low. At this time, $\phi_R$ is at the same level as $\phi_1$ rather than being at the fat zero level $V_F$. The fat zero charge at 90 has propagated to well 108 and combined with the first loss charge packet $eS_j$.

At time $t_{10}$, the (j+1)'th charge is present in well 90. At time $t_{11}$, the j'th charge has propagated to well 116 beneath electrode 118.

At time $t_{12}$, the loss charge packet plus fat zero charge propagates to well 112 leaving behind a second order charge packet $e^2S_j$ at 108. The j'th charge is in well 116 at this time. At time $t'_0$, which is the beginning of a new period, the charges are shown in FIG. 9. The j'th charge at level $(1-2e)S_j$ is in well 116, the fat zero plus the sum loss charge packet $F+(2e-e^2)S_j$ is present in well 112, and the second order charge loss packet $e^2S_j$ is present in well 108. As these charges continue to propagate down the CCD, the losses continue with the charge signal getting smaller by the fraction e each transfer, with the fat zero plus sum charge packet increasing in size by substantially $eS_j$ with each transfer and with the second order charge loss packet also increasing in size with each transfer. During various points in each period, there will be present in each group of four potential wells of a stage, three charge packets in three of the wells, respectively, and the fourth well will be empty. As contrasted to the previous embodiments, in the present embodiment the charge summing stage delays the charge signal one period to allow the trailing loss charges and the fat zero charge to combine therewith. It will be recalled that in the previous embodiments, the trailing charges are advanced until they meet and combine with the charge signals from which they are derived.

Figure 11:
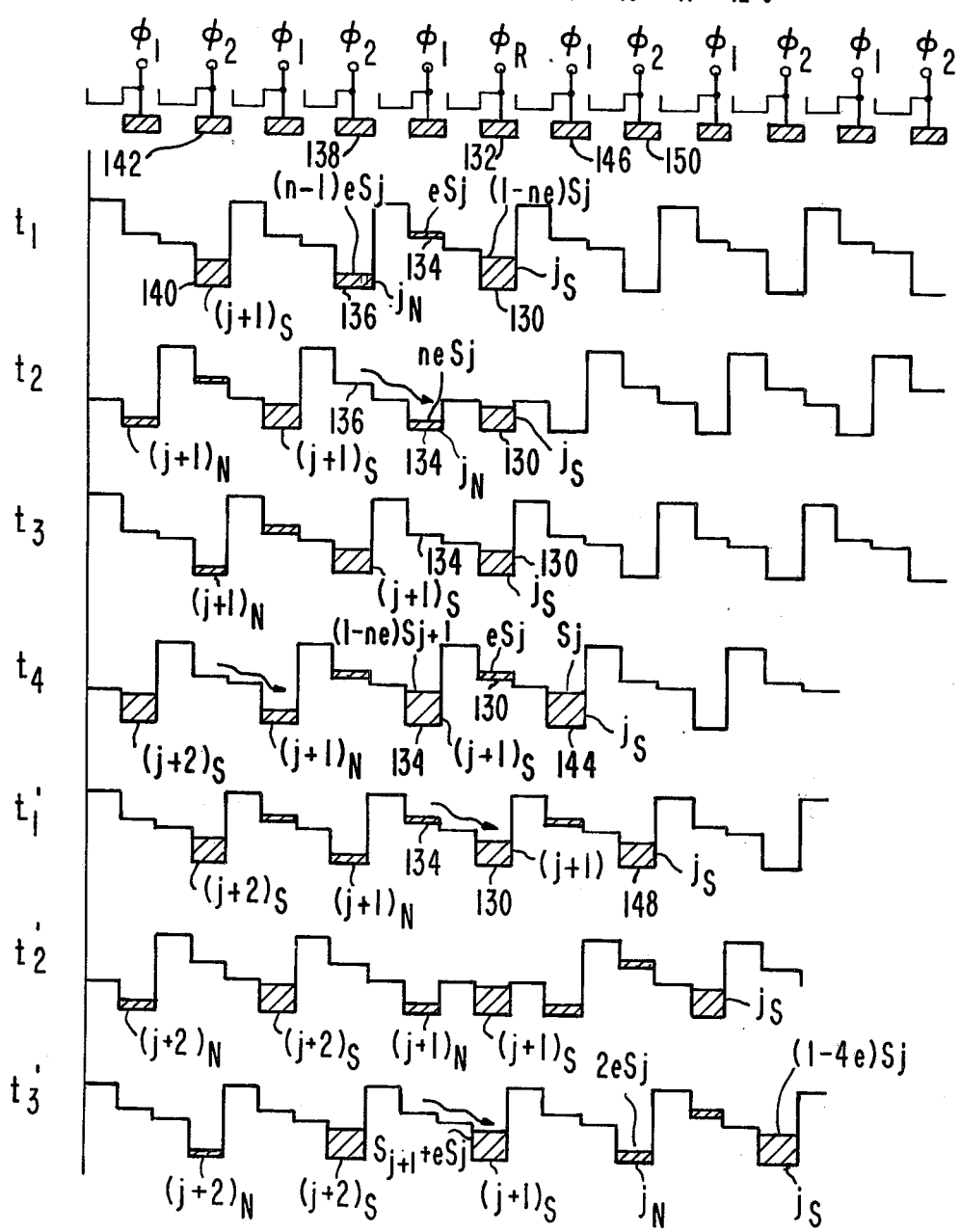
FIG. 11 is a schematic showing of another embodiment of the invention and of surface potential profiles.
Figure 12:
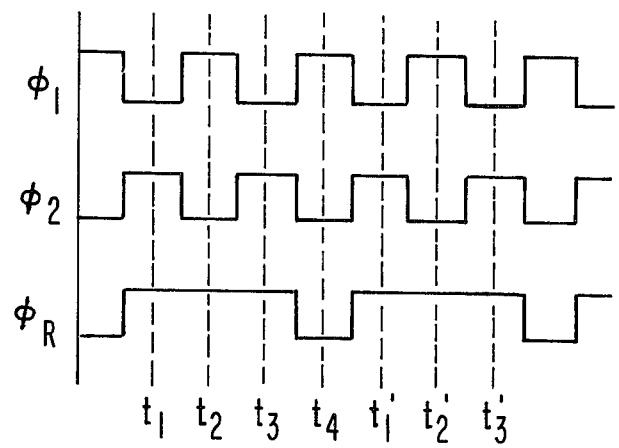
FIG. 12 is a drawing of waveforms employed for the operation of FIG. 11.

FIG. 11 illustrates an embodiment of the invention using a two-phase symmetrical clock voltage illustrated in FIG. 12. While this operation is sometimes termed "push-clock" operation, more correctly it is a combination of push and drop clock operation in that during a transfer the charge carriers concurrently are "pushed" from one potential well and "dropped" into the adjacent preceding well. This embodiment alternatively can be operated with an overlapping push-clock voltage or a non-overlapping drop-clock voltage.

In all of these embodiments, as contrasted to the conventional two-phase systems in which charge signal can be present at each stage, in the present systems the charge signal is present only in alternate stages and the charge loss packets accumulate in the remaining alternate stages. In the discussion of the operation of the circuit which follows, both the driving waveforms of FIG. 12 and the surface potential profiles of FIG. 11 should be referred to.

At time $t_1$, the j'th charge signal $j_s$ is present in potential well 130 beneath electrode 132. Its level is $(1-ne)S_j$. During the transfer of this charge, a small transfer loss $(1-ne)eS_j \approx eS_j$ (since ne $<<1$) has occurred at 134. The sum charge loss packet $j_N$ of level $(n-1)eS_j$ is present in the preceding potential well 136 beneath electrode 138. The following or $(j+1)_s$ charge signal is present in the preceding potential well 140 beneath electrode 142.

At time $t_2$, $\phi_1$ and $\phi_R$ are high and $\phi_2$ is low. The sum charge loss packet $j_N$ formerly at 136 has propagated to well 134 and combined with the charge $eS_j$ to form a new sum charge loss packet of amplitude $neS_j$. The $j_s$ charge signal of amplitude $(1-ne)S_j$ remains in well 130.

At time $t_3$, $\phi_2$ and $\phi_R$ are high and $\phi_1$ is low. The sum charge loss packet $j_N$ of level $neS_j$ formerly at 134 has propagated to well 130 and has combined with the j'th charge signal of level $(1-ne)S_j$ to restore the j'th charge signal to close to its original level $S_j$.

At time $t_4$, $\phi_1$ is high and $\phi_2$ and $\phi_R$ are low. The restored charge signal $j_s$ has travelled from well 130 to well 144 beneath electrode 146, leaving a loss charge $eS_j$ behind at 130. The following charge signal $(j+1)_S$ is present in the potential well 134.

At time $t'_1$, $\phi_1$ is low and $\phi_2$ and $\phi_R$ are high. The j'th charge signal $j_s$ has propagated to potential well 148 beneath electrode 150 leaving a loss charge $eS_j$ behind. The $(j+1)_S$ charge signal has propagated to well 130 where it has combined with the charge loss packet $eS_j$ left behind by the $j_s$ signal. This combination of the charge loss $eS_j$, left behind by the j'th charge signal, with the (j+1)'th charge signal of level $(1-ne)S_{j+1}$ to provide a sum charge packet $[(1-ne)S_{j+1} + eS_j]$ in well 130 represents an additional effective charge loss which in this structure takes place once each signal restoring stage. Because the first charge loss e from the j'th charge signal is combined with the following, that is, the $(j+1)_S$ charge signal, as the j'th charge signal $j_s$ continues to propagate, the sum charge loss packet behind it always has $eS_j$ less charge than it should have. For example, as shown at $t'_3$, the last surface potential profile illustrated, the level of the j'th charge is $(1-4e)S_j$ whereas the loss charges trailing it sum up to only $3eS_j$. Neglecting the second order, that is, the $e^2$ losses, when the combining takes place later, after n shifts, where n may be some number such as 500 or more, the j'th charge will not be fully restored to its initial level. One loss charge packet $eS_j$ will be missing and, of course, the $e^2$ terms are also left behind. However, as the fraction e is a very small number, of the order of $10^{-5}$, or so, this loss is quite insignificant, especially as compared to the ne error that would otherwise obtain.

Figure 13:
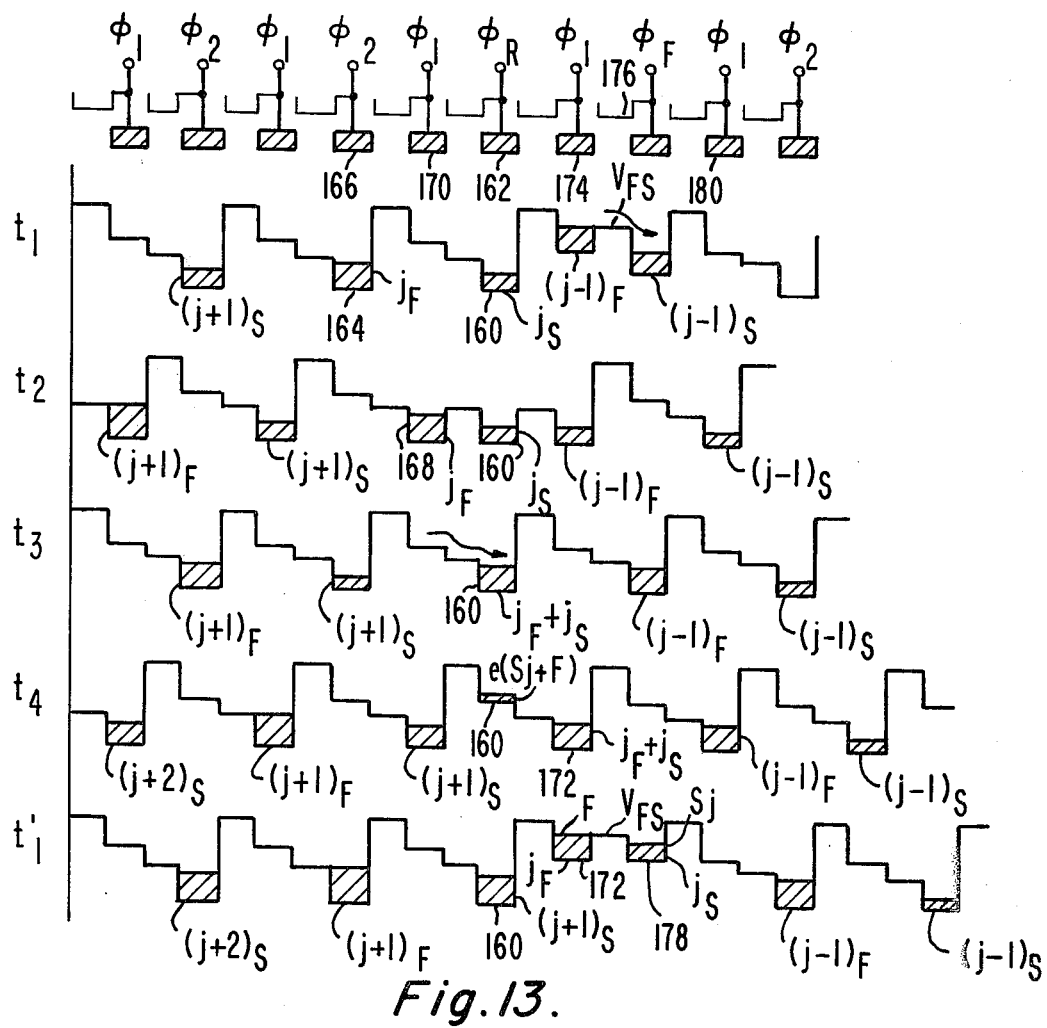
FIG. 13 is a schematic showing of another embodiment of the invention and of surface potential profiles.

FIG. 13 illustrates a two-phase clock embodiment of the invention in which there are trailing fat zero charges plus sum charge loss packets at alternate stages and signal charges in the remaining alternate stages. Both FIGS. 13 and 14 should be referred to in the discussion which follows.

At time $t_1$, $\phi_1$ is low, $\phi_2$ and $\phi_R$ are high at the desired transfer voltage level and $\phi_F$ is at the fat zero level $V_F$.

Note that $\phi_R$ is applied to an electrode in the summing stage which would correspond to a $\phi_2$ electrode. $\phi_F$ is applied to the following stage, also to an electrode which corresponds to a $\phi_2$ electrode. At time $t_1$, the j'th charge $j_s$ is present in potential well 160 and beneath electrode 162 and the fat zero plus sum charge loss packet, legended $j_F$, is present in the potential well 164 beneath electrode 166.

At time $t_2$, $\phi_1$ and $\phi_R$ are high and $\phi_2$ and $\phi_F$ are low. The j'th charge $j_s$ of level $(1-ne)S_j$ remains in well 160 and the fat zero plus sum loss charge packet $j_F$ of level $F+neS_j$ has propagated from well 164 to well 168 beneath electrode 170.

At time $t_3$, $\phi_1$ is low and $\phi_2$, $\phi_R$ and $\phi_F$ are high, all at the transfer level. The charge $j_F$ formerly at 168 has combined with the charge signal $j_s$ present in well 160 to provide a sum charge packet $F_j+S_j$.

At time $t_4$, $\phi_1$ is high and the remaining drive voltages are low. The combined charge $j_s+j_F$ formerly in well 160, has shifted to well 172 beneath electrode 174, leaving a loss charge packet $e(S_j+F)$.

As it was previously explained, the charge transfer loss due to the fat zero can be neglected after the device operation reaches a steady state. These losses will tend to cancel, since the charge loss at one stage of $eF$ is made up by charge gain of equal amount $(eF)$ from the previous stage.

At time $t'_1$, the fat zero surface potential $V_{FS}$ produced beneath electrode 176 forms a potential barrier between well 172 and the deeper well 178 beneath electrode 180. Some of the charge signal formerly present in well 172 has flowed over the barrier into well 178. This charge $j_s$ is the restored j'th charge of level $S_j$. The charge in well 172 is the restandardized fat zero charge. The transfer loss packet $(eF+S_j)$ at 160, time period $t_4$, combines at time $t'_1$ with the $(j+1'\text{th})_S$ charge signal in well 160. This small charge packet therefore has been lost from the $j_s$ charge and represents the effective loss at each signal restoring stage.

In the various embodiments of the invention discussed in which fat zeros are present, the surface potential $V_{FS}$ generated beneath one electrode such as 176 in FIG. 13 may not be exactly the same as that generated beneath another electrode corresponding to 176 to another fat zero standardizing stage within the system. This may be due to differences in the threshold voltage $V_{TH}$ of the different gate electrodes caused by small differences in distance from the substrate, or by other factors. This possible difference in $V_{TH}$s from one stage to the other does not substantially adversely affect operation. The reason is that all signals processed at a particular stage, such as 174, 176, 180 of FIG. 13, "see" the same threshold level at that stage and all such signals therefore have the same amount of fat zero charge removed at that stage. Accordingly, if one compares one charge signal with another, their relative amplitudes with respect to one another will still be the same, even if the threshold voltage $V_{TH}$ is not identical in each and every fat zero standardizing stage.

Figure 15A:
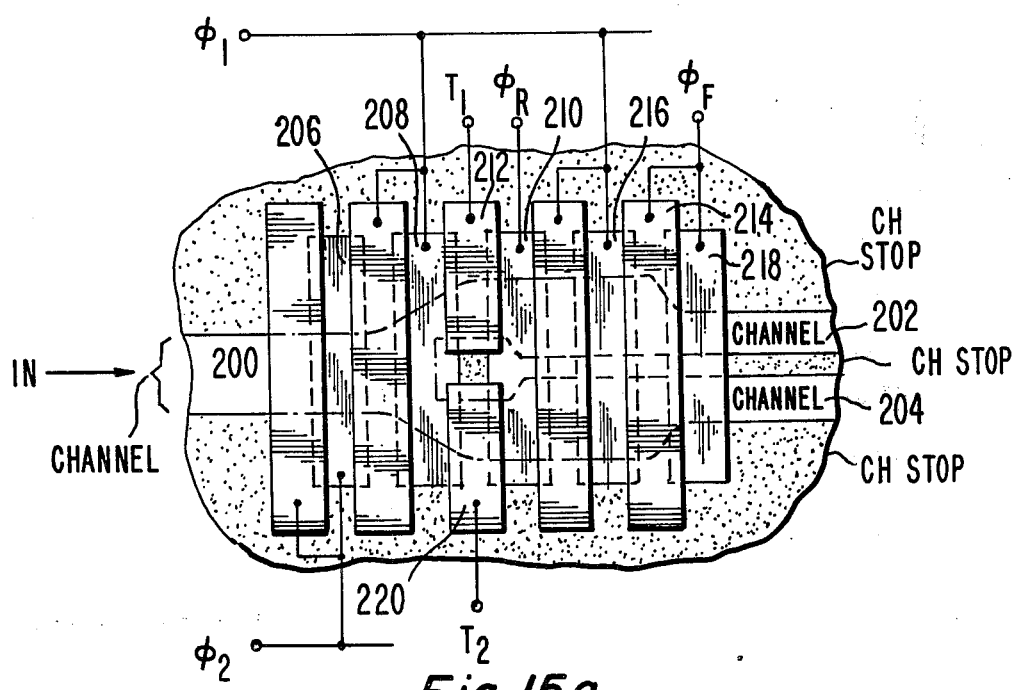
FIGS. 15a, 15b and 15c are plan views of the input end, a center region, and the output end of another embodiment of the invention—this one employing two channels.
Figure 15B:
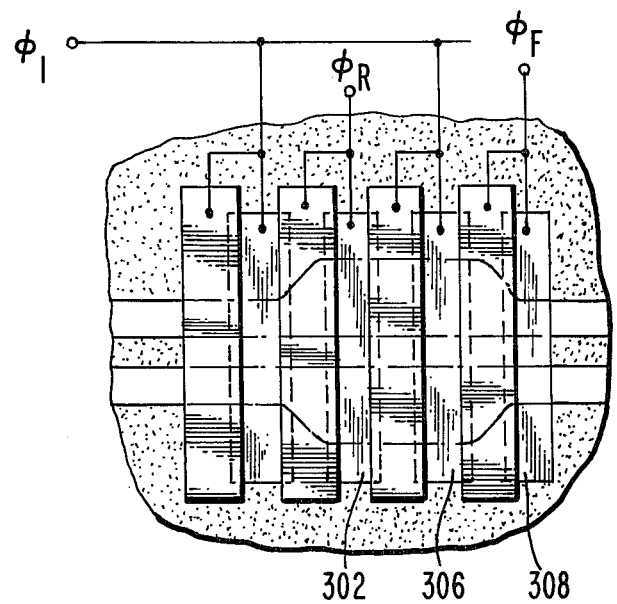
Figure 15C:
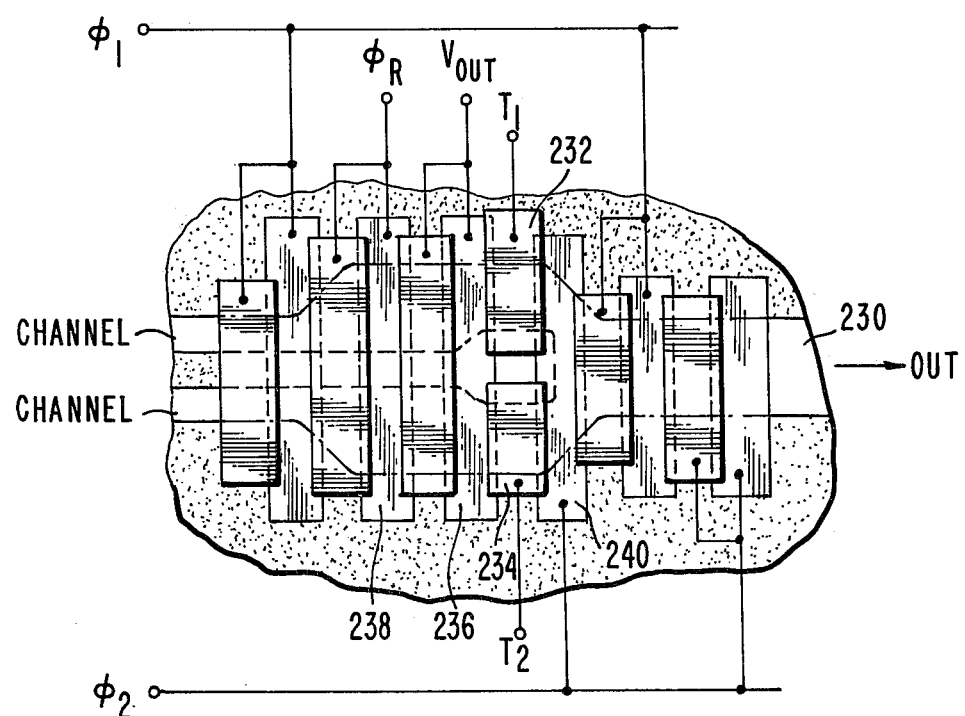

FIGS. 15a, 15b and 15c together illustrate another embodiment of the invention, this one employing two separate channels. In this system, the charge signals arrive from a standard two-phase CCD input channel 200 and are alternately gated between the upper and lower channels 202 and 204, respectively. Each signal in channel 200 consists of the sum charge packet $(j_F+j_s)$, where $j_s$ is the signal component and $j_F$ is a fat zero component. These two components are subsequently separated when the signals enter the channels 202 and 204 by the action of the gate electrodes 214, 218 driven by $\phi_F$. In more detail, each packet $j_F+j_s$ is separated into two packets, one $j_s$ followed by the other $j_F$, these two packets being placed in two separate potential wells.

Figure 16:
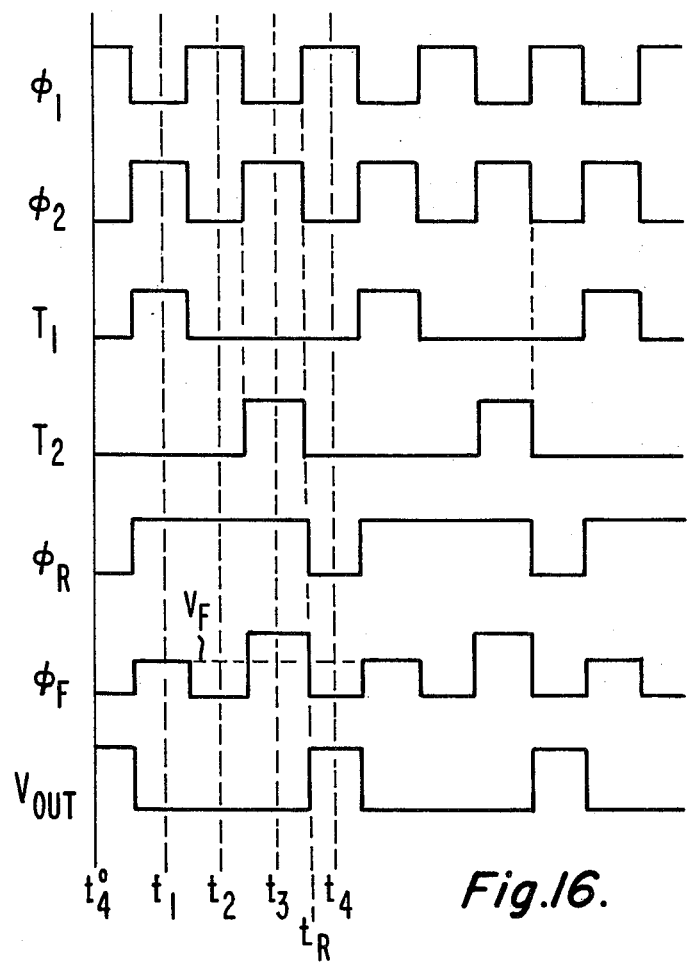
FIG. 16 is a drawing of waveforms for operating the circuit of FIGS. 15a–15c.

Referring to FIG. 16, at time $t_1$ the control voltage $T_1$ is high and $\phi_2$ is high. At this period the $j+1$'th charge is assumed to be present in the potential well beneath $\phi_2$ electrode 206. The j'th signal plus fat zero charge packet formerly present beneath electrode 208 is gated to the potential well beneath electrode 210 in the upper channel 202 via the gate electrode 212. At the same time, $\phi_F$ is high at the fat zero level $V_F$. This establishes beneath electrode 214 a fat zero surface potential $V_{FS}$. The $(j-2)_S$ charge formerly present beneath electrode 216 in the upper channel, has flowed over this potential barrier $V_{FS}$ and into the potential well beneath electrode 218 in the upper channel. At the same time, the $(j-1)_S$ charge formerly present beneath electrode 216 in the lower channel has flowed over this potential barrier $V_{FS}$ and into the potential well beneath electrode 218 in the lower channel. Thus, at time $t_1$ the $(j-2)_S$ charge in the upper channel is restored to substantially its initial charge level $S_{j-2}$ and a standard fat zero charge is present in the well beneath electrode 216 in the upper channel.

Similarly, at time $t_1$ the $(j-1)_S$ charge in the lower channel 204 is restored to substantially its initial charge level $S_{j-1}$ and a standard fat zero charge F is present in the well beneath electrode 216 in the lower channel.

At time $t_2$, $\phi_1$ is high and the $j+1$ charge beneath electrode 206 has propagated to beneath electrode 208. At time $t_3$, $T_2$ is high and $\phi_2$ is high; also $\phi_F$ is high at the transfer level. As $t_2$ is high, the $j+1$'th charge signal has transferred from the well beneath electrode 208 via transfer gate 220 to the well beneath electrode 210 in the lower channel 204. As $\phi_F$ is high, the fat zero charge formerly present beneath electrode 216 in both channels 202 and 204 transfers to beneath electrode 128.

At time $t_4$, $\phi_1$ is high and $\phi_R$ is low. The $J+1$'th charge signal then transfers from the potential well beneath electrode 210 in lower channel 204 to the potential well beneath electrode 126 in this lower channel, while the j'th charge signal transfers from the potential well beneath electrode 210 in the upper channel 202 to the potential well beneath electrode 216 in the upper channel. The remainder of the operation of the input circuit is believed to be self-evident from what has already been described.

Figure 14:
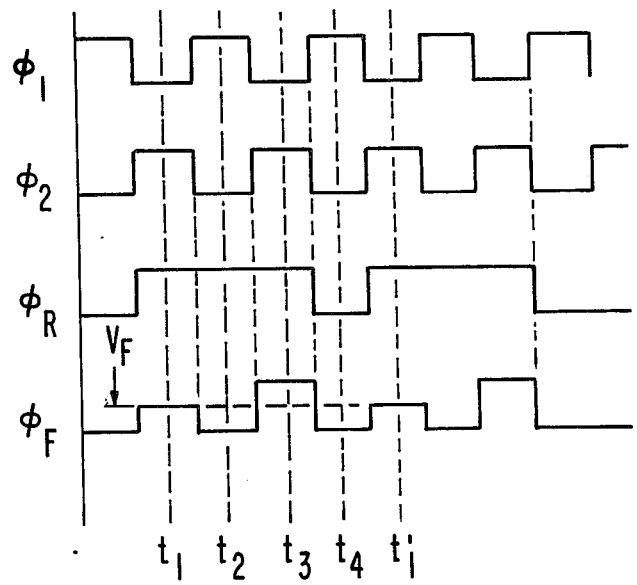
FIG. 14 is a drawing of waveforms employed for operating the circuit of FIG. 13.

The operation of a summing and fat zero standardizing stage, one set of two such stages being shown in FIG. 15b, is the same as has already been described in connection with FIGS. 13 and 14. The number of such sets of stages will depend upon n and the length of the CCD register.

The CCD channel width is increased under the storage gates 302 and 306 of the signal restoring stage because at these locations the charge signals are combined with the fat-zero charges. The wider channel under these gates increases the charge signal capacity of these wells.

FIG. 15c illustrates the output end of the system. Here, the charge signal trains in the upper and lower channels are alternately gated into a single output channel 230.

The function of the first part of the output structure in FIG. 15c is to combine the signal charge with the fat-zero charge. This is accomplished under electrode 238 in response to the pulse $\phi_R$. Then, the combined signals in both channels are stored in the wells under the gate 236 under the control of voltage pulse $V_{OUT}$. From there the two combined charge signals are transferred in sequence into a single output channel 230, the two gates 232 and 234 controlling the alternate merging of signals from the upper and lower channel into the common output channel 230 by means of a drop-clock type of transfer. Referring to FIG. 16, at time $t_1$ during the coincidence of the $T_1$ pulse and clock phase $\phi_2$ the charge stored in the upper channel in the well under gate 236 controlled by voltage $V_{OUT}$ is transferred into the common output channel under gate 240. Then at time $t_3$ during the pulse of $T_2$ and phase voltage $\phi_2$, the charge stored in the lower channel under the gate 236 is transferred to the common channel under the gate 240.

In summary, in the embodiment illustrated by FIGS. 15 and 16, the input signal includes a large fat zero, that preferably is larger than the signal charge. The input structure alternately gates the incoming charge signals into two parallel low-loss channels, thus providing two stages of the CCD register for each signal sample. Another function of the input structure is to delay the fat-zero charge one stage following each signal charge. In this operation, each stage containing a charge signal is followed by a stage with a fat zero charge. The stage containing the fat zero charge collects the transfer losses suffered by the preceding signal charge. The function of the large fat zero charge is to reduce trapping type losses in the CCD channel.

A feature of the system of FIG. 15 is the use of common multiple phase electrodes for controlling the propagation of charge signals in two channels. For a given amount of information, the physical length of the CCD of FIG. 15 can be approximately one half that of the previous embodiments described, but at the cost of a small number of additional gate electrodes (212, 220, 232 and 234) for controlling the multiplexing and demultiplexing, and the requirement for some additional control voltages $T_1$, $T_2$ and $V_{OUT}$. From another point of view, the embodiment in FIG. 15 should be compared with a conventional two-phase CCD register. Here, at the cost of additional input and output structures, and the restoring stages low loss operation is achieved. Since the operation with the trailing large fat zero can be immune to the charge-trapping type edge effect losses, the total channel width of the low-loss double-channel structure may be comparable to the width of the single conventional CCD register.

What is claimed is:

1. A charge-coupled device circuit comprising:
   a charge-coupled device (CCD) which includes a semiconductor substrate, a plurality of electrode means insulated from the substrate to which multiple phase voltages may be applied for creating a succession or stream of potential wells in said substrate separated from one another by potential barriers in said substrate, said wells for the storage and propagation in a desired direction, hereafter termed "downstream," of signal charge packets, each such signal charge packet, when propagating downstream from potential well to potential well, suffering a small transfer loss during each such transfer which is manifested as a loss charge and the loss charges derived from each signal charge packet adding to one another to form a sum loss charge packet which trails the signal charge packet from which it is derived;
   said CCD including means for introducing into one potential well in each group of potential wells produced by P adjacent electrode means, a fat zero charge packet, said one well following the one containing the signal charge packet, the sum loss charge packet derived from any signal charge packet combining with the fat zero charge packet following that signal charge packet, where P is an integer equal to at least 3;
   said CCD including also after every n of said electrode means a charge combining stage, said combining stage comprising one of said electrode means receptive of a control voltage other than one of said multiple phase voltages for relatively delaying each signal charge packet with respect to its combined fat zero and sum loss charge packet in a potential well, hereafter termed a "summing potential well," formed by said electrode means, and another of said electrode means for propagating said combined fat zero and sum loss charge packet downstream through a distance such that it combines with the signal charge packet from which the sum loss charge packet was lost, in said summing potential well, to form a reconstituted signal plus fat zero charge packet, where n is equal to at least 50;
   said charge combining stage including means responsive to said control voltage for separating said fat zero charge packet from said reconstituted charge packet, at a standard fat zero level and retaining said fat zero charge in a potential well adjacent to and following the one containing the remainder of said reconstituted charge signal packet; and
   each said charge combining stage being followed by a plurality of said electrode means to which said multiple-phase voltages are applied for the storage and propagation in said downstream direction of each said reconstituted signal charge packet followed by its fat zero charge packet.

2. A charge-coupled device circuit as set forth in claim 1, wherein said means for introducing a fat zero charge packet comprises means for introducing a fat zero charge packet of greater amplitude than the respective signal charge packets.

3. In a charge transfer device of the type having a semiconductor substrate, a plurality of gate electrode means insulated from the substrate to which voltages are applied for inducing potential wells in the substrate for the storage of signal charge packets and for the transfer of such signal charge packets in a desired transfer direction and in which each signal charge packet as it is shifted in said desired direction from the potential well in the region of the substrate beneath one gate electrode means to the potential well in the region of the substrate beneath the next adjacent gate electrode means, suffers a small transfer loss which is manifested as a charge and in which transfer loss charges derived from each signal charge packet add to one another to form a sum loss charge packet which is propagated behind that signal charge packet, and in which there is present between each signal charge packet and the following signal charge packet a fat zero charge packet which combines with the sum loss charge packet to form a combined charge packet which propagates behind each signal charge packet between it and the following signal charge packet, a method for compenstaing for the charge losses suffered by each signal charge packet while the signal charge packet is still in the form of a charge packet and for restandardizing the level of the fat zero charge packet comprising the steps, after each n shifts of each signal charge packet, of first combining with that signal charge packet the combined charge packet trailing that signal charge packet to form a summed reconstituted signal plus fat zero charge packet, the combining taking place in one of said potential wells, and then separating the summed reconstituted signal charge packet into a first part comprising a reconstituted signal charge packet which includes at least the major part of the charge losses suffered by that signal charge packet during the n shifts of the signal charge packet, and a second part trailing the first part, comprising a fat zero charge packet at a standardized level.

4. A method as set forth in claim 3 wherein said combining step is accomplished by relatively delaying each signal charge packet, after each n shifts thereof, for a length of time sufficient to permit the sum loss charge packet derived therefrom combined with the fat zero charge packet to reach the same region of the substrate as the signal charge packet and to combine therewith.

5. A method as set forth in claim 3 wherein said fat zero charge packets are of greater amplitude than said signal charge packets.

6. A charge-coupled device (CCD) circuit comprising, in combination:

a single input CCD having a common output port, said single input CCD comprising a semiconductor substrate and electrodes insulated from the substrate to which multiple-phase voltages are applied for inducing potential wells in the substrate for storing and propagating successive charge packets introduced at said input along the length of said CCD, said charge packets including successive signal charge packets of magnitude S, where S may vary, and each signal charge packet suffering a transfer loss manifested as a loss charge packet eS during each transfer of the signal charge packet, where e is a small fraction, the loss charge packets of amplitude eS derived from each signal charge packet combining with one another to form a sum loss charge packet of amplitude xeS which trails that signal charge packet, where x represents the number of transfers made by the signal charge packet from which the sum loss charge packet is derived;

N CCD's, each also including a semiconductor substrate and electrodes insulated from the substrate to which multiple-phase voltages may be applied for inducing potential wells in the substrate for storing and propagating charge packets;

means for gating the output signal charge packets appearing at said common output port of said input CCD into the N CCD's, with each N'th signal charge packet going to a different such CCD, said gating means including a gate electrode structure for steering successive signal charge packets into different ones of said N CCD's during successive time periods, and including also an electrode structure common to said N CCD's for placing each signal charge packet received from said input channel into a potential well which is followed by at least two other potential wells, one for receiving transfer loss charge packets and summing them to form a sum loss charge packet of amplitude xeS and the other operating as a transfer well for the succeeding signal charge packet;

said N CCD's each including at least one charge combining stage, said stages each including electrode means receptive of a control voltage manifestation for combining each signal charge packet reaching that stage with the sum loss charge packet following that signal charge packet which has been lost from that charge packet to form a reconstituted signal charge packet, when x is a value equal to at least 50;

a single output CCD comprising a semiconductor substrate and electrodes insulated from the substrate to which voltages may be applied for inducing potential wells in the substrate for the storage and transfer of charge packets, said output CCD having a common input port;

means for interleaving the N reconstituted signal charge packets produced by said N CCD's, respectively, and applying the interleaved signal charge packets to said common input port of said output CCD during successive time periods so that they appear in the same order there as they did in said input CCD; and wherein said charge packets in said input CCD include successive fat zero charge packets of magnitude F, each fat zero charge packet following a signal charge packet, wherein said electrode structure of said means for gating said output of said input CCD includes means for separating each charge packet into its signal component in one potential well followed by its fat zero component in the following one of said at least two potential wells, wherein each charge combining stage includes means for adding also to each signal charge packet the fat zero charge packet immediately following the signal charge packet, and wherein all except for the charge combining stage of said means for interleaving include also, means for separating each fat zero charge packet from its signal charge packet, at said standard magnitude level F, and placing the fat zero charge packet in a potential well following the one containing the signal charge packet.

7. A charge-coupled device circuit as set forth in claim 6 wherein said fat zero charge packets have a magnitude F which is greater than the magnitude of the respective signal charge packets.

* * * * *